(12) United States Patent
Miyahara et al.

(10) Patent No.: US 8,580,649 B2
(45) Date of Patent: Nov. 12, 2013

(54) METHOD FOR MANUFACTURING SEMICONDUCTOR DEVICE

(75) Inventors: Jiro Miyahara, Chuo-ku (JP); Nan Wu, Chuo-ku (JP)

(73) Assignee: Elpida Memory, Inc., Tokyo (JP)

( * ) Notice: Subject to any disclaimer, the term of this patent is extended or adjusted under 35 U.S.C. 154(b) by 13 days.

(21) Appl. No.: 13/455,660

(22) Filed: Apr. 25, 2012

(65) Prior Publication Data

US 2012/0276713 A1 Nov. 1, 2012

(30) Foreign Application Priority Data

Apr. 26, 2011 (JP) .................................. 2011-098269

(51) Int. Cl.
*H01L 21/76* (2006.01)

(52) U.S. Cl.
USPC ..................... 438/424; 438/435; 257/E21.546

(58) Field of Classification Search
USPC ......... 438/296, 297, 362, 426, 435, 436, 438, 438/439; 257/E21.546
See application file for complete search history.

(56) References Cited

U.S. PATENT DOCUMENTS

| 7,582,555 | B1 | 9/2009 | Lang et al. | |
| 2006/0094203 | A1* | 5/2006 | Choi et al. | 438/424 |

OTHER PUBLICATIONS

Chung, et al., "Novel Shallow Trench Isolation Process Using Flowable Oxide CVD for Sub-100nm DRAM", IEDM, 2002, pp. 233-236.

* cited by examiner

*Primary Examiner* — Hoai V Pham
(74) *Attorney, Agent, or Firm* — Sughrue Mion, PLLC

(57) ABSTRACT

Disclosed is a method for manufacturing a semiconductor device, which provides an isolation region in which a dense silicon oxide film is formed in a trench that requires high aspect ratio. The method includes forming an isolation trench using, as an etching mask, a nitride mask film formed on a substrate, forming a liner nitride film in the isolation trench, depositing a flowable silazane compound by a CVD method such that the height of the flowable silazane compound is higher than the upper surface of the nitride mask film from the upper portion of the trench, performing heat treatment under an oxidizing atmosphere to convert the flowable silazane compound film into a silicon oxide film and simultaneously densifying therefore, and planarizing the silicon oxide film to the height of the upper surface of the nitride mask film.

20 Claims, 6 Drawing Sheets

(a)　　　　　　　　　　(b)

(a)　　　　　　　　　　(b)

(a)  (b)

(a)  (b)

| Note | Overfilling Amount (nm) | Wet Etching Rate (nm/min) | Etching Rate Ratio |
|---|---|---|---|
| ○ | 0 | 41.7 | 1.00 |
| ■ | 50 | 43.6 | 1.04 |
| ◇ | 300 | 61.1 | 1.46 |

METHOD FOR MANUFACTURING SEMICONDUCTOR DEVICE

BACKGROUND OF THE INVENTION

1. Field of the Invention

The present invention relates to a method for manufacturing a semiconductor device, and more particularly, to a method which forms an isolation region with a narrow isolation width on a semiconductor substrate without leaving voids, surface dents or the like. In addition, the present invention relates to a method for simultaneously forming an isolation region with a narrow isolation width and an isolation region with a wide isolation width.

2. Description of the Related Art

When forming a switching element such as a transistor on a semiconductor substrate in a semiconductor device such as a dynamic random access memory (DRAM), an isolation region is formed and a transistor region (active region) is defined in the semiconductor substrate. In recent semiconductor devices, shallow trench isolation (STI) is generally performed to form an isolation region and fill a trench formed in a semiconductor substrate with an insulating material.

A filling method in the STI for manufacture of semiconductor devices tends to be restricted by a high aspect ratio caused by miniaturization, and defective fill (voids) may occur in conventional high-density plasma chemical vapor deposition (HDP-CVD) techniques in forming an isolation region having an isolation width of 100 nm or below by STI.

To overcome such a problem, a method which employs a spin-on-dielectric (SOD) film has been proposed as a method for filling, in a void-free manner, a trench formed by STI. However, the SOD film uses a solvent, which may cause environmental harm. Moreover, impurities derived from the applied solvent may remain in the formed film, which may affect on characteristics of semiconductor elements. Therefore, a flowable CVD method has been proposed to replace the method employing the SOD film. The filling process in the flowable CVD method uses organosilane or organosiloxane as a raw material, forms a flowable silicon compound (mostly, silanol ($Si(OH)_4$)) film by the CVD method, and converts the film to a silicon oxide film by an oxidation reaction. The flowable silicon compound film may sink into a narrow space, thereby improving gap-fill performance and leaving no voids (U.S. Pat. No. 7,582,555).

However, in the filling process by the flowable CVD method, although not so serious as those in the SOD film, film shrinkage may occur during conversion into the oxide film, and therefore, the oxide film in the isolation region formed by STI and having a narrower isolation width tends to be more porous. The less dense oxide film has a high wet etching rate, which may easily cause to defects in processing.

To solve the above-enumerated problems, a shallow trench isolation process in which a flowable CVD method and an HDP-CVD method are combined has been proposed by Sung-Woong Chung et al., ("Novel shallow trench isolation process using flowable oxide CVD for sub-100 nm DRM", Electron Devices Meeting, 2002, IEDM'02, Digest. International, p. 233 to 236). Chung et al. have proposed a stacked structure in that an oxide film formed by a flowable CVD method which enables excellent filling is used as bottom-up fill, and an oxide film formed by an HDP-CVD method which provides superior film quality is stacked on the oxide film formed by the flowable CVD method.

The present inventors have recognized that, in the aforementioned stacked structure, it is significant to control the height of the bottom-up fill oxide film in a memory cell region. If the height of the bottom-up fill oxide film is low, the oxide film formed by an HDP-CVD method may have defective fill (voids).

Furthermore, the present inventors have recognized that silicon oxide films formed by conventional flowable CVD methods tend to be porous, which may lead to a high wet etching rate. For example, wide isolation regions are formed together with narrow isolation regions in a semiconductor device such as a DRAM, however, silicon oxide films formed by a flowable CVD method may suffer from problems of different heights of bottom-up fill oxide films caused by isolation widths. When wet etching is performed in the final step of a process for forming an isolation region, the etching rapidly progresses when a silicon oxide film is obtained by a flowable CVD method with a high wet etching rate from the oxide film formed by an HDP-CVD method with a low wet etching rate, which may result in non-uniform heights of surfaces of isolation regions.

SUMMARY

The present Inventors have studied methods for filling a trench which requires a high aspect ratio as an isolation region in a memory cell region of a DRAM by STI, with an oxide film formed by a flowable CVD method, and found a method for providing a dense silicon oxide film having a low wet etching rate, which will be described as follows.

According to one embodiment of the present invention, there is provided a method for manufacturing a semiconductor device, including etching a semiconductor substrate using a silicon nitride mask film formed on the semiconductor substrate as a mask to form a first isolation trench corresponding to a first isolation region; forming a liner silicon nitride film on at least an inner surface of the first isolation trench; depositing a flowable silazane compound by a CVD method such that the first isolation trench is filled with the flowable silazane compound by overfilling up to a height higher than the upper surface of the silicon nitride mask film in the vicinity of the first isolation trench; heat-treating the flowable silazane compound under an oxidizing atmosphere to convert the flowable silazane compound into a first silicon oxide and to densify the first silicon oxide; and planarizing the first silicon oxide to the height of the upper surface of the silicon nitride mask film.

According to another embodiment of the present invention, there is provided a method for manufacturing a semiconductor device, including etching a semiconductor substrate using a silicon nitride mask film formed on the semiconductor substrate as a mask to form a first isolation trench corresponding to a first isolation region and a second isolation trench corresponding to a second isolation region having an isolation width wider than that of the first isolation region; forming a liner silicon nitride film on at least inner surfaces of the first and second isolation trenches; depositing a flowable silazane compound by a CVD method such that the first isolation trench is filled with the flowable silazane compound by overfilling up to a height higher than the upper surface of the silicon nitride mask film in the vicinity of the first isolation trench; heat-treating the flowable silazane compound under an oxidizing atmosphere to convert the flowable silazane compound into a first silicon oxide and to densify the first silicon oxide; forming a second silicon oxide on the first silicon oxide; and planarizing the first and second silicon oxides to the height of the upper surface of the silicon nitride mask film.

According to still another embodiment of the present invention, there is provided a method for manufacturing a semiconductor device, including forming a first isolation trench and a second isolation trench by etching the semiconductor substrate, a width of the second isolation trench being wider than that of the first isolation trench; depositing a flowable compound in the second isolation trench and in the first isolation trench, a height of the flowable compound at the first isolation trench being higher than the surface of the semiconductor substrate; annealing the flowable compound to convert into a first insulation film; and depositing a second insulation film on the first insulation film.

According to one embodiment of the present invention, although the conversion of the flowable silazane compound into the first silicon oxide film by heat treatment is accompanied with volume shrinkage, a space for vertical film shrinkage can be ensure by overfilling the flowable silazane compound up to a level higher than the upper surface of the silicon nitride mask film, and thus it is possible to prevent the first silicon oxide from being porous.

The present invention uses a flowable silazane compound, and thus does not cause dehydration during conversion into the first silicon oxide, which might otherwise occur in conventional methods using flowable silanols. Therefore, volumetric shrinkage of the film is small, and the combination of overfill may prevent the first silicon oxide from being porous.

BRIEF DESCRIPTION OF THE DRAWINGS

The above feature and advantages of the present invention will be more apparent from the following description of certain preferred embodiments taken in conjunction with the accompanying drawings, in which.

DETAILED DESCRIPTION OF THE PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrates for explanatory purpose.

The present invention discloses a method appropriate for forming an isolation region having an isolation width of 100 nm or below, particularly, an isolation region having a fine isolation width above the 65-nm node. Hereinafter, the isolation region having such a fine isolation width is referred to as a first isolation region. Meanwhile, it is preferred that the first isolation region has an aspect ratio (depth/isolation width) of 3 or higher.

In addition to the first isolation region, a semiconductor device often has an isolation region (hereinafter, referred to as a second isolation region) having an isolation width wider than that of the first isolation region. A method for forming the second isolation region simultaneously with the first isolation region will be hereinafter described; however, the invention is not limited thereto.

In the manufacturing processes according to one embodiment of the present invention, first, a silicon nitride film serving as a hard mask is formed on a semiconductor substrate. Prior to the formation of the silicon nitride film, a pad silicon oxide film for protecting the surface of the semiconductor substrate can be formed. The silicon nitride film is properly formed into an optimum thickness in accordance with the depth of the isolation region to be formed in the semiconductor substrate. Generally, the thickness of the silicon nitride film is approximately 50 to 100 nm.

Subsequently, the thus-formed silicon nitride film is patterned by a photolithography technique so as to be processed into a hard mask. As a result, a pattern of a silicon nitride mask film corresponding to an active region (hereinafter, referred to as "a first active region") surrounded by the first isolation region is formed. In addition, a pattern of a silicon nitride mask film corresponding to an active region (hereinafter, referred to as "a second active region") surrounded by the second isolation region is formed. The second active region may have a shape same as or different from the shape of the first active region. The first and second isolation regions are not necessarily separated from each other, and the first and second isolation regions can be connected with each other. In such cases, an active region which is surrounded by the first and second isolation regions exists. In the description below, the first and second active regions may be simply described as "an active region" for explanatory convenience.

Figure 1:
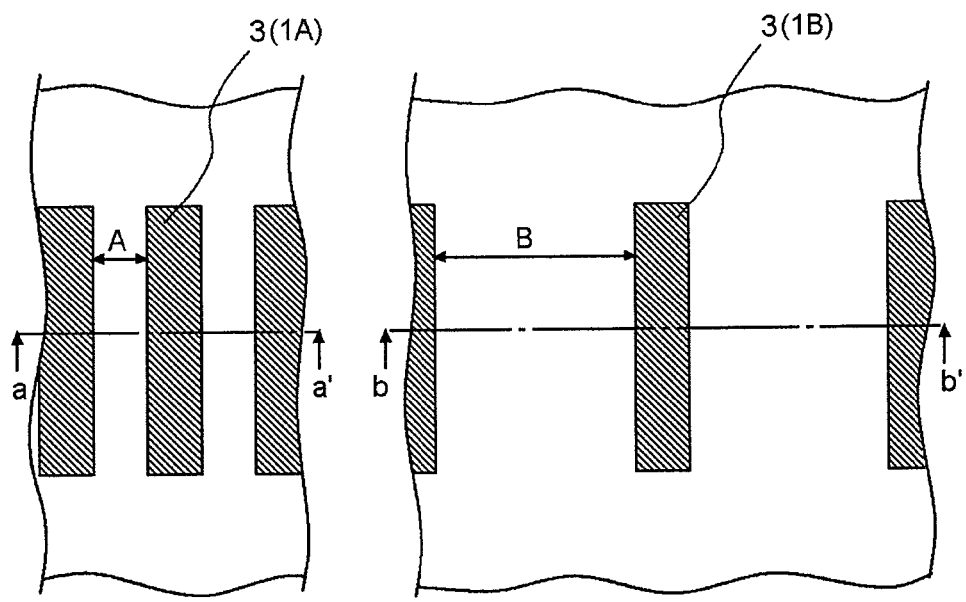
FIG. 1 is a plane view illustrating a first isolation region having a narrow isolation width and a second isolation region having a wide isolation width applicable to the present invention.

FIG. 1 is a plane view illustrating an example of forming a silicon nitride mask film 3 corresponding to an active region on a surface of a semiconductor substrate 1, wherein the narrow area between adjacent silicon nitride mask films 3 is region A corresponding to the first isolation region, and the area wider than region A is region B corresponding to the second isolation region. A portion under the silicon nitride mask film 3 interposed between regions A is a first active region 1A, and a portion under the silicon nitride mask film 3 interposed between regions B is a second active region 1B.

The semiconductor substrate 1 is etched using the thus-formed silicon nitride mask film 3 as a mask to form a first isolation trench corresponding to the first isolation region. In addition, a second isolation trench corresponding to the second isolation region is formed.

Figure 2:
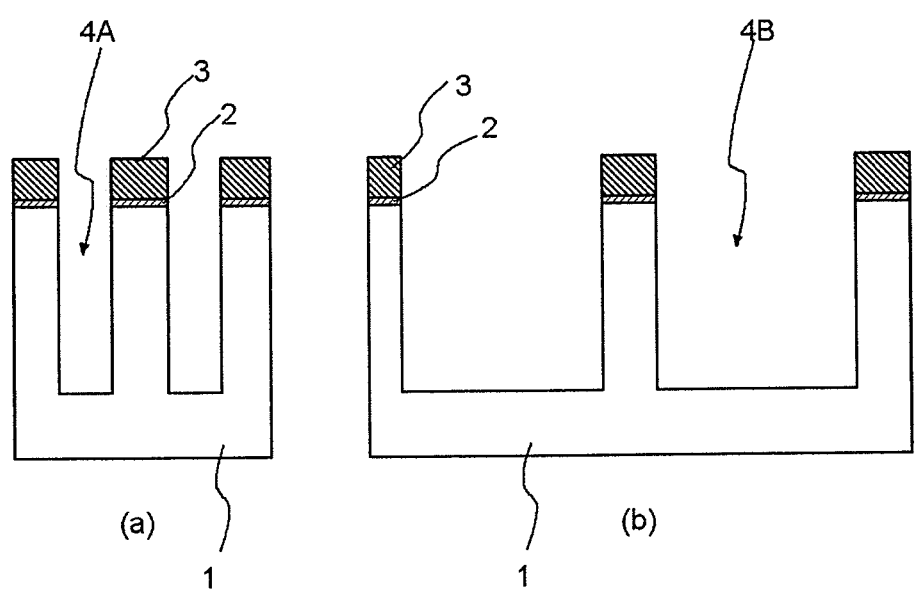
FIG. 2 to FIG. 9 are cross-sectional views illustrating processes of a method for manufacture according to one embodiment of the present invention, wherein each (a) is a cross-sectional view taken along line a-a' of FIG. 1 and each (b) is a cross-sectional view taken along line b-b' of FIG. 1.

FIG. 2 is a cross-sectional view illustrating processes of a method for manufacture. FIG. 2(a) is a cross-sectional view taken along line a-a' of FIG. 1 and FIG. 2(b) is a cross-sectional view taken along line b-b' of FIG. 1. The same applies to the following FIG. 3 to FIG. 10. In the example shown in FIG. 2, a pad silicon oxide film 2 is formed between the semiconductor substrate 1 and the silicon nitride mask film 3. Thus, a first isolation trench 4A and a second isolation trench 4B are formed. For example, the first isolation trench 4A has an opening width of 50 nm, and the second isolation trench 4B has an opening width of 200 nm, and each trench has a depth of approximately 150 to 300 nm.

Figure 3:
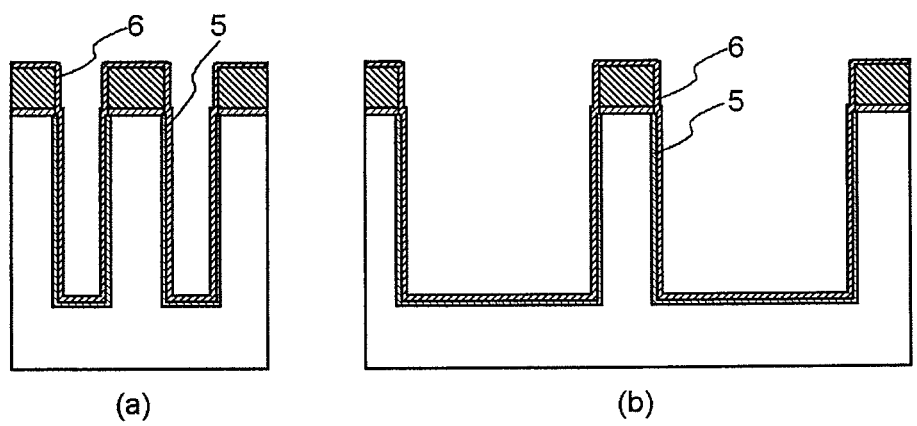

Subsequently, as shown in FIG. 3, a liner silicon nitride film 6 is formed all over the semiconductor substrate including an inner wall of the first isolation trench 4A. The liner silicon nitride film 6 is formed on an inner wall of the second isolation trench 4B, and also formed all over a side wall and an upper surface of the silicon nitride mask film 3. In the meantime, a thin liner silicon oxide film 5 can be formed on inner walls of the first and second isolation trenches prior to the formation of the liner silicon nitride film 6. The liner silicon oxide film 5 can be formed by oxidizing the semiconductor substrate (silicon substrate) exposed in the first and second isolation trenches using an in-situ steam generation (ISSG) oxidation method. In addition, the liner silicon nitride film 6 can be a stacked film of a silicon nitride film and a silicon oxynitride (SiON) film. Here, the liner silicon oxide film 5 can have a thickness of, for example, 1 to 4 nm, and the liner silicon nitride film 6 can have a thickness of, for example, 2 to 8 nm. Meanwhile, the liner silicon nitride film 6 can be formed by preparing the liner silicon oxide film 5 having a thick thickness and then nitriding the surface of thus thicken liner silicon oxide film 5. In this case, the liner silicon nitride film 6 is not formed on the surface of the silicon nitride mask film 3.

Figure 4:
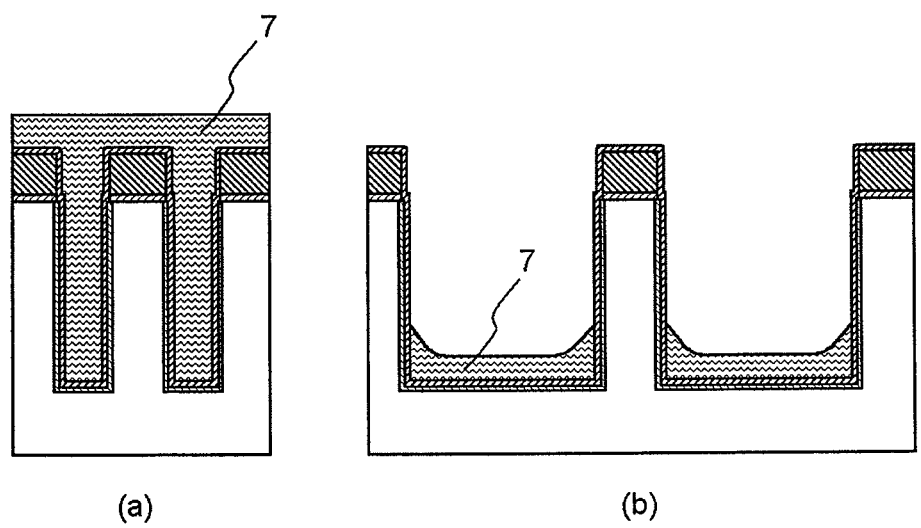

Next, as shown in FIG. 4, a flowable silazane compound is deposited on the liner silicon nitride film 6 such that the flowable silazane compound is completely filled in the first isolation trench 4A and overfilled on the liner silicon nitride film 6 over the silicon nitride mask film 3 to form a flowable silazane compound film 7. The surface of the flowable silazane compound film 7 is located above the first isolation trench 4A with a predetermined height from the upper surface of the silicon nitride mask film 3. Here, the upper surface of the silicon nitride mask film 3 in the present invention is defined as the upper surface of the liner silicon nitride film 6 if the film 6 is formed on the silicon nitride mask film 3. Such a surplus deposition is hereinafter called as "overfill". This overfill aims to ensure a space for vertical film shrinkage in a conversion from the flowable silazane compound to silicon oxide in a post process, and also to make the height above the silicon nitride mask film 3 same with the height above the first isolation trench 4A to enable a separate planarization process after heat treatment. When the overfilling height (that is, an overfilling amount) is too high, a conversion to silicon oxide in a post process may not be properly performed as it goes to the bottom of the first isolation trench 4A. As a result, a porous silicon oxide film may remain in the vicinity of the opening of the first isolation trench 4A in the process of permitting the silicon oxide film to etch back to the height of the upper surface of the semiconductor substrate by wet etching after a planarization process by a chemical mechanical polishing method (CMP) using the silicon nitride mask film 3 as an etching stopper, thus may cause a significant surface dent. Therefore, the method of the present invention provides a predetermined overfill. The overfilling amount will be described later.

The height of the surface of the flowable silazane compound film 7 varies in accordance with the isolation width of the second isolation region in the second isolation trench 4B. This is because a flowable silazane compound is a fluid having high surface energy, and therefore, in the first isolation trench 4A having a narrow width, the flowable silazane compound flows from an opening of the first isolation trench 4A and fills the trench 4A in a top-down manner and remains as an overfill in an upper portion of the first isolation trench 4A by surface tension, while in the second isolation trench 4B having a wide width, the flowable silazane compound on the silicon nitride mask film 3 is drawn downwardly from a wall surface of the second isolation trench 4B so that a little deposited amount of the flowable silazane compound may remain on the silicon nitride mask film 3 although the deposited amount varies depending on the width of the active region between the second isolation trenches 4B. Moreover, the deposited amount is small to fill the second isolation trench 4B having a wide width, and therefore, the height of the surface of the flowable silazane compound film 7 is lower than the upper surface of the silicon nitride mask film 3 in the second isolation trench 4B, and further, is lower than the surface of the semiconductor substrate 1 as shown. The flowable silazane compound film 7 may be formed to fill all of the second isolation trenches 4B; however, such a formation of the film 7 may not satisfy a condition of a predetermined amount of overfill on the first isolation trench 4A. Meanwhile, ruffling (concave meniscus) occurs at the wall surface of the second isolation trench 4B by the surface tension of the flowable silazane compound.

The term "a flowable silazane compound" used throughout the description of the present embodiment is a compound having a Si—NH bond in the structure thereof. This compound is different from a polysilazane film which is generally used as an SOD film, and is a fluid (gelated) material of a silazane-based compound obtained by a chemical vapor deposition instead of the polysilazane film being dissolved in a solvent and coating.

The flowable silazane compound film 7 is generally deposited by a gas phase method such as CVD, including vaporizing a raw material compound (for example, aminosilanes, silazanes, etc.) containing Si and N, partially modifying as needed, depositing and fluidizing the silazane compound to fill the first isolation trench.

Figure 5:
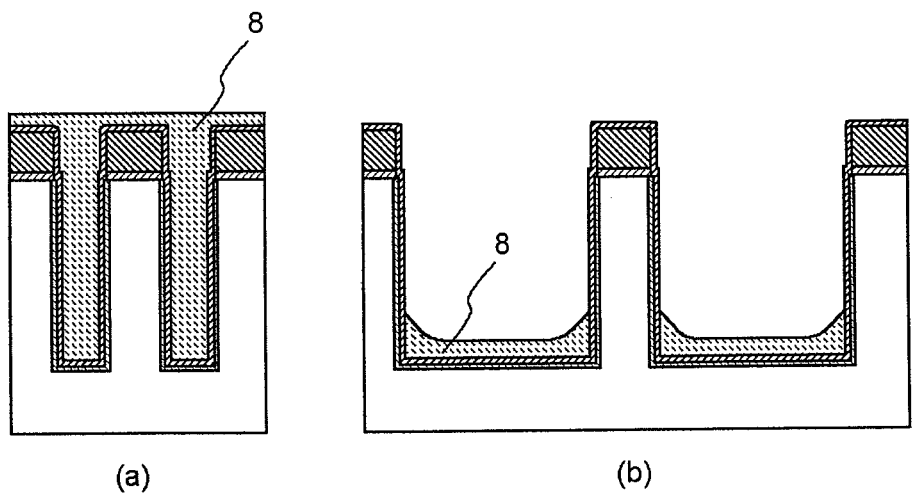

Next, as shown in FIG. 5, the thus-formed flowable silazane compound film 7 can be converted into a desired first silicon oxide (a first silicon oxide film 8) through a heat treatment (annealing). In the heat treatment, it is preferable that a densification of the first silicon oxide film 8 is performed simultaneously with the conversion into the first silicon oxide film 8. In addition, the heat treatment is performed under at least an oxidizing atmosphere to convert the residual Si—NH bond to a Si—O bond. It is preferable to form a liner silicon nitride film in the trench as described above to prevent the semiconductor substrate from being oxidized during the heat treatment. The first silicon oxide film 8 obtained by oxidizing the flowable silazane compound film 7 has a wet etching rate which depends on the temperature of the heat treatment, and the etching rate becomes lower as the heat treatment is performed at a higher temperature. A conversion into the first silicon oxide film is possible at a temperature higher than 200° C.; however, it is preferable to perform the heat treatment at a temperature higher than 700° C. to simultaneously perform the densification. Meanwhile, the isolation width of the isolation region of the present invention becomes narrower as the device generation is progressed. Under such situations, it may be difficult to form the liner silicon nitride film which prevents oxidation of the substrate, into a sufficiently thick thickness for inhibiting oxidation at a higher temperature. Therefore, the heat treatment is preferably performed at a temperature of 1000° C. or below, and more particularly, at a temperature of 900° C. or below under an oxidizing atmosphere. In addition, the heat treatment can be performed through single or multiple stages. For example, a first stage heat treatment is performed under an oxidizing atmosphere at a relatively lower temperature of approximately 200° C. to 500° C. to convert a Si—NH bond to a Si—O bond, a second stage heat treatment is performed under an oxidizing atmosphere at a temperature of 700° C. to 900° C. to convert the residual Si—NH bond to a Si—O bond and simultaneously be subjected to a densification, and a third stage heat treatment is performed under an inert gas atmosphere at a temperature of 700° C. to 1000° C. to be subjected to an additional densification. By the heat treatment performed through multiple stages as described above, degasification from the first silicon oxide film can be easily carried out in the first stage heat treatment prior to the densification of the first silicon oxide film. Moreover, an oxidation of the semiconductor substrate can be suppressed by two stage densifications under an oxidizing atmosphere and then under an inert gas atmosphere. The oxidizing atmosphere can be achieved in the presence of well-known oxidants such as oxygen ($O_2$), ozone ($O_3$), water ($H_2O$) and the like; and, it is preferable to perform under a wet oxidizing atmosphere using, particularly, water (water vapor, i.e., steam). Preferably, the second stage heat treatment is performed under the wet oxidizing atmosphere at a temperature of 700° C. to 900° C. for a period ranging from 30 to 120 minutes. The present inventors have found that the first silicon oxide film obtained in the wet oxidizing process performed at 900° C. has a wet etching rate nearly equivalent to that of a silicon oxide film formed through an HDP-CVD process, which will be described later. The relationship between the heat treatment temperature and wet etching rate will be described later.

Figure 6:
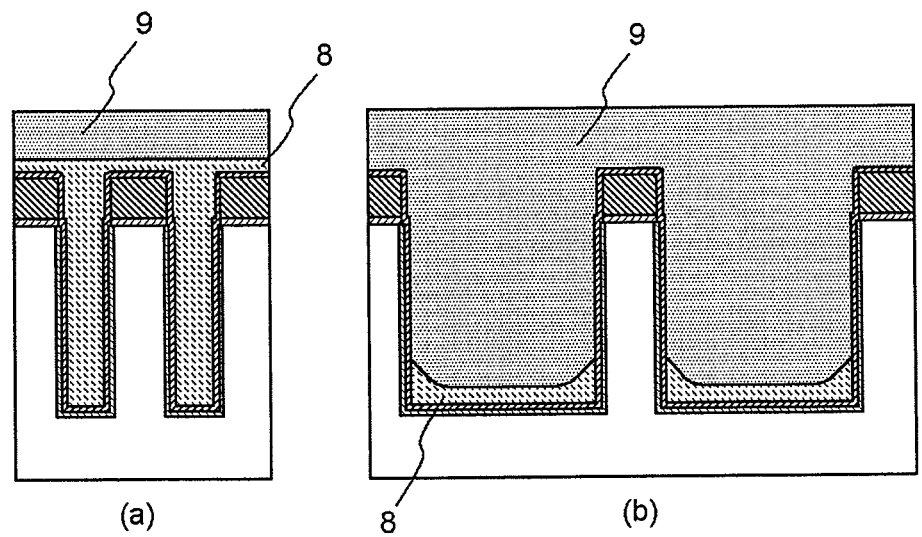

Subsequently, as shown in FIG. 6, another silicon oxide (that is, a second silicon oxide film 9) through an HDP-CVD process is deposited on the first silicon oxide film 8. The second isolation trench 4B is filled with the second silicon oxide film 9. Here, the second silicon oxide film 9 is deposited also on the first silicon oxide film 8 above the first isolation trench 4A.

Figure 7:
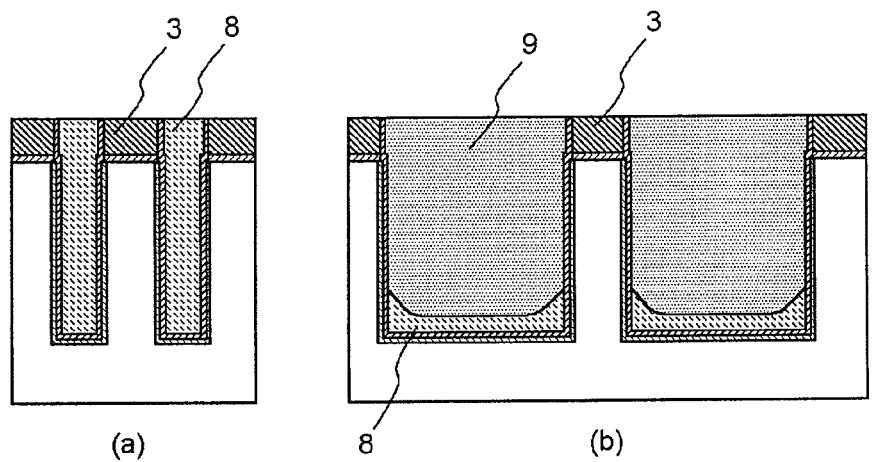

Subsequently, as shown in FIG. 7, the first silicon oxide film 8 and the second silicon oxide film 9 are planarized by CMP using the silicon nitride mask film 3 as an etching stopper. Thus, only the first silicon oxide film 8 remains in the first isolation trench 4A, and a stacked structure that the second silicon oxide film 9 is formed on the first silicon oxide film 8 remains in the second isolation trench 4B.

Figure 8:
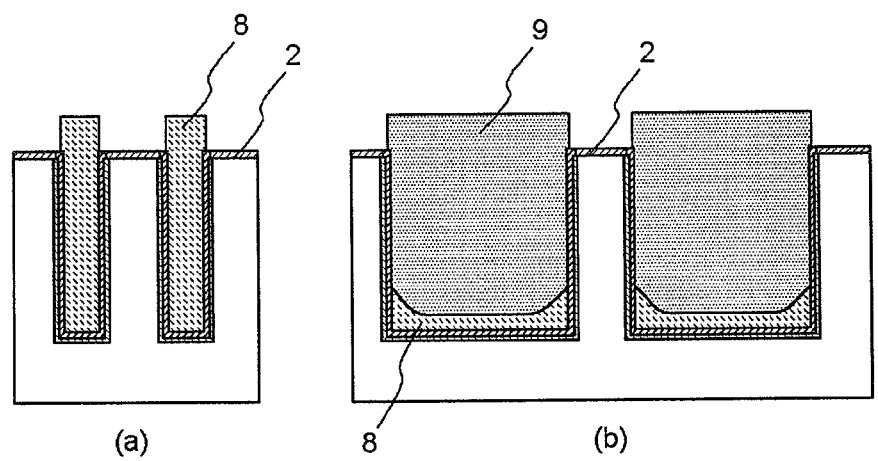

Subsequently, as shown in FIG. 8, the silicon nitride mask film 3 and the liner silicon nitride film 6 on the semiconductor substrate 1 are removed. A wet etching process using thermal phosphoric acids can be applied in removing the films.

Figure 9:
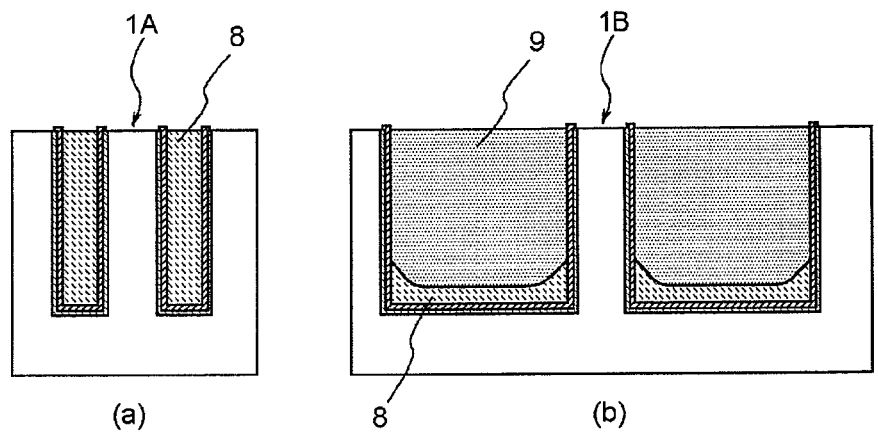

Finally, as shown in FIG. 9, the first silicon oxide film 8 and the second silicon oxide film 9 are etched back to the height of the surface of the substrate. When the pad silicon oxide film 2 is formed, the pad silicon oxide film 2 is also removed. The etch back can adopt wet etching using dilute hydrofluoric acids or buffered hydrofluoric acids as a chemical solution. The wet etching of the first silicon oxide film 8 and the second silicon oxide film 9 shown in FIG. 9 can be carried out prior to the removal of the silicon nitride mask 3 and liner silicon nitride film 6. In addition, the etch back of the first silicon oxide film 8 and the second silicon oxide film 9 can be performed prior to the removal of the silicon nitride mask 3 and liner silicon nitride film 6 in the middle portion between the surface of the liner silicon nitride film 6 on the silicon nitride mask 3 and the surface of the substrate, then the silicon nitride mask 3 and liner silicon nitride film 6 are removed, and after that, the residual first silicon oxide film 8 and second silicon oxide film 9 can be wet-etched to the height of the surface of the substrate.

Thus, the first isolation region having a narrow isolation width and the second isolation region having a wide isolation width are completed.

Meanwhile, although the second silicon oxide film is formed by HDP-CVD in the above-described process, the present invention is not limited thereto, and other known methods for forming silicon oxide films can be applied.

EXPERIMENTAL EXAMPLE 1

Investigation of Overfilling Amount

Figure 10:
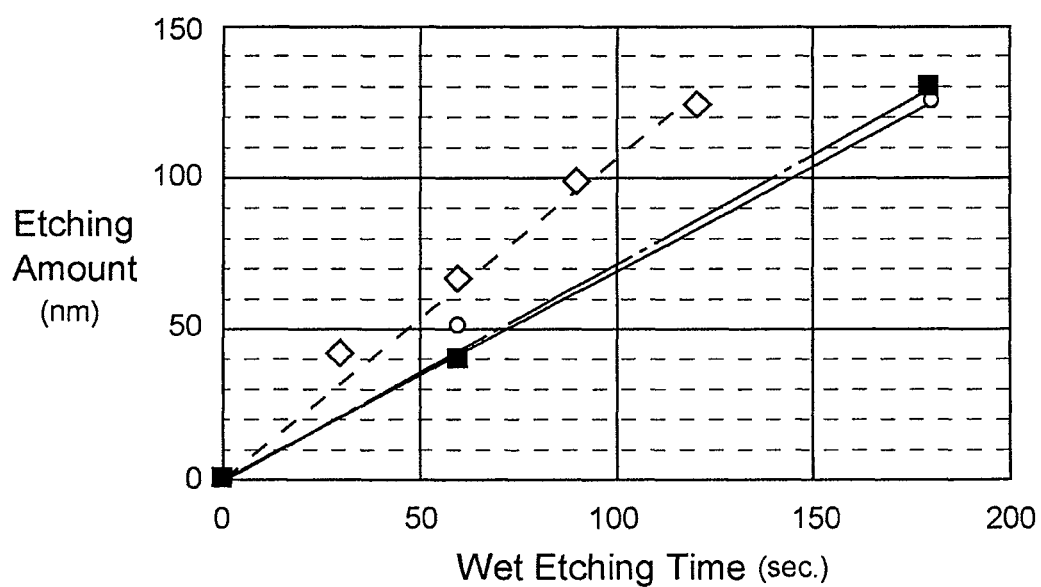
FIG. 10 is a view illustrating a relationship between the overfilling amount of a flowable silazane compound film and a wet etching rate of a first silicon oxide film converted from the flowable silazane compound film.

Now, the aforementioned overfilling amount of the flowable silazane compound film 7 will be explained. The present inventors have performed an experiment in that the flowable silazane compound film 7 is formed by varying the overfilling amount, heat treatment including wet oxidation at 300° C. for 30 minutes, wet oxidation at 800° C. for 60 minutes and nitrogen treatment at 800° C. for 30 minutes is performed to convert the flowable silazane compound film 7 to the first silicon oxide film 8 and simultaneously perform a densification process, a planarization process by CMP is performed as described above, and an etching rate in wet etching is measured. The overfilling amount is set to 0 nm (that is, the height of the upper surface of the flowable silazane compound film 7 over the first isolation trench is the same as the height of the upper surface of the liner silicon nitride film 6 on the silicon nitride mask film 3), 50 nm and 300 nm. Formation of the second silicon oxide film 9 by a HDP-CVD process is not performed. A planarization process by CMP is not performed in case of 0 nm. Accordingly, the etching rate in case of 50 nm and 300 nm is not the etching rate of the surface as-deposited after conversion to the first silicon oxide film 8 but the etching rate of the surface after the overfill is polished. The results are shown in FIG. 10. As shown in FIG. 10, the etching rate in case of the overfilling amount of 300 nm is approximately 1.5 times (i.e., etching rate ratio ≅1.5) to that of the overfilling amount of 0 nm, while the etching rate in case of the overfilling amount of 50 nm is approximately same (i.e., etching rate ratio ≅1) to that of the overfilling amount of 0 nm. The present inventors have found that planarization in the first silicon oxide film alone is possible in the condition of the overfilling amount of 30 nm or more even when volume shrinkage after the densification occurs, and the etching rate ratio is nearly equal to that of overfilling amount of 0 nm in the condition of the overfilling amount of 70 nm or below. Therefore, the overfilling amount is preferably set to the range of 30 to 70 nm.

EXPERIMENTAL EXAMPLE 2

Investigation of Heat Treatment Temperature

Figure 11:
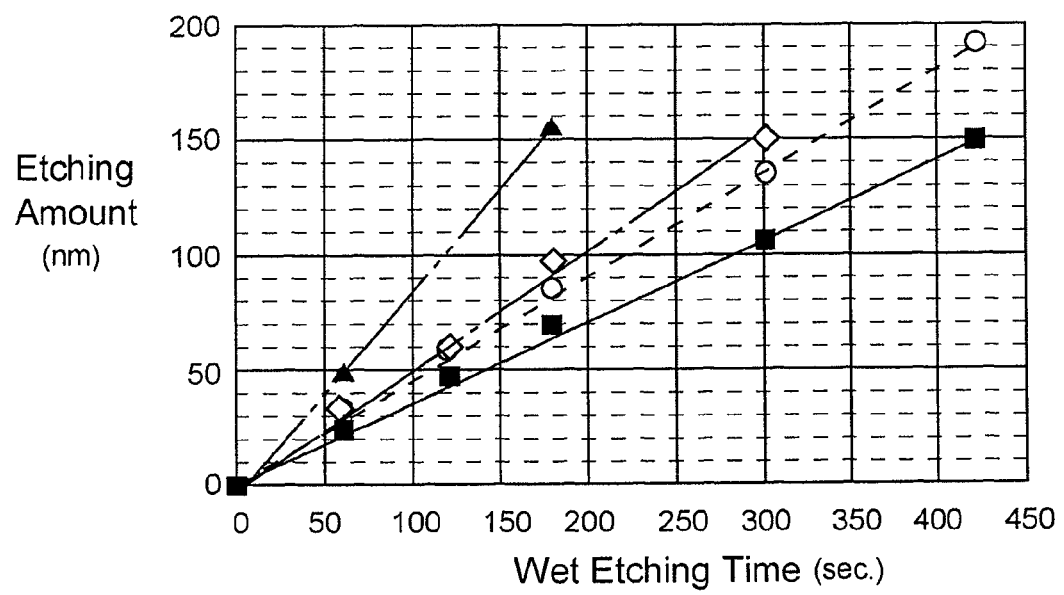
FIG. 11 is a view illustrating a relationship between the temperature of wet oxidation of a flowable silazane compound film and a wet etching rate of a first silicon oxide film converted from the flowable silazane compound film.

The present inventors have studied a heat treatment temperature. The study is conducted on the heat treatment temperature of a high temperature for densification. Test samples are formed by depositing the flowable silazane compound with the overfilling amount of 50 nm and then heat-treating with a first wet oxidation (first stage heat treatment) at 300° C. for 30 minutes, subsequent a second wet oxidation (second stage heat treatment) at temperatures shown in FIG. 11 for 60 minutes, and the third heat treatment for 30 minutes at the temperature same as that of the second wet oxidation under an inert gas atmosphere. In addition, the comparison of the test samples is carried out using a silicon oxide film formed by HD-CVD as a control. The results of the comparison are shown in FIG. 11. As shown in FIG. 11, the wet etching rate becomes lower as the heat treatment temperature rises. As aforementioned, the required thickness of the liner silicon nitride film is thick in a wet oxidation process at 1000° C., and therefore, it may be difficult to form a narrow isolation region. In the wet oxidation at 900° C., the etching rate of the first silicon oxide film is nearly same as that of the second silicon oxide film formed by HDP-CVD, and therefore, it is most preferable to perform the heat treatment at 900° C. in the experimental example. Meanwhile, the heat treatment performed under an inert gas atmosphere may affect less an oxidation of a semiconductor substrate, and therefore, the heat treatment may be performed at 900° C. under an inert gas atmosphere after performing wet oxidation at 700° C.

As can be seen in the above-described results, it is preferable to adjust the heat treatment condition so that the wet etching rate ratio of the first silicon oxide film to the second silicon oxide film is in the range of 0.7 to 1.3, more preferably, 0.8 to 1.2, and more preferably nearly 1.

In the application scope of the present invention, a narrow isolation region in a memory cell region of a semiconductor device such as a DRAM can be formed as a first isolation region, and an interfacial region between the memory cell region and a peripheral circuit region and an isolation region of the peripheral circuit region can be formed as a second isolation region. In addition, a plurality of second isolation regions having different isolation widths can exist as a second isolation region as long as each isolation width is larger than that of the first isolation region. In cases where a plurality of isolation regions having different isolation widths exist as a second isolation region, and if at least one isolation region is configured with a stacked structure of a first silicon oxide film and a second silicon oxide film, the isolation region of which isolation width is narrower than that of the at least one isolation region can configured with a first silicon oxide film alone.

What is claimed is:

1. A method for manufacturing a semiconductor device, comprising:
    etching a semiconductor substrate using a silicon nitride mask film formed on the semiconductor substrate as a mask to form a first isolation trench corresponding to a first isolation region;
    forming a liner silicon nitride film on at least an inner surface of the first isolation trench;
    depositing a flowable silazane compound by a CVD method such that the first isolation trench is filled with the flowable silazane compound by overfilling up to a height higher than the upper surface of the silicon nitride mask film in the vicinity of the first isolation trench;
    heat-treating the flowable silazane compound under an oxidizing atmosphere to convert the flowable silazane compound into a first silicon oxide and to densify the first silicon oxide; and
    planarizing the first silicon oxide to the height of the upper surface of the silicon nitride mask film.

2. The method for manufacturing a semiconductor device according to claim 1, wherein the overfilling height of the flowable silazane compound above the first isolation trench is a height of 30 to 70 nm from the upper surface of the silicon nitride mask film.

3. The method for manufacturing a semiconductor device according to claim 1, wherein the heat-treating the flowable silazane compound comprises a heat treatment performed at a temperature of 700° C. to 900° C. for 30 to 120 minutes under a water vapor-containing atmosphere.

4. The method for manufacturing a semiconductor device according to claim 3, wherein the heat-treating the flowable silazane compound comprises a first stage heat treatment performed at a temperature of 200° C. to 600° C., a second stage heat treatment performed at a temperature of 700° C. to 900° C., wherein the first and second stage heat treatments are performed under the water vapor-containing atmosphere, and a third stage heat treatment performed at a temperature of 700° C. to 1000° C. under an inert gas atmosphere.

5. The method for manufacturing a semiconductor device according to claim 1, wherein the liner silicon nitride film is formed on a surface of the silicon nitride mask film and the upper surface of the silicon nitride mask film is an upper surface of the liner silicon nitride film.

6. The method for manufacturing a semiconductor device according to claim 1, wherein the silicon nitride mask film has a film thickness in the range of 50 to 100 nm.

7. The method for manufacturing a semiconductor device according to claim 1, further comprising forming a pad silicon oxide film on a surface of the semiconductor substrate prior to the forming the silicon nitride mask film.

8. The method for manufacturing a semiconductor device according to claim 1, further comprising forming a liner silicon oxide film on an inner wall of the first isolation trench prior to the forming the liner silicon nitride film.

9. The method for manufacturing a semiconductor device according to claim 8, wherein the liner silicon oxide film has a film thickness of 1 to 4 nm.

10. The method for manufacturing a semiconductor device according to claim 1, wherein the liner silicon nitride film has a film thickness of 2 to 8 nm.

11. The method for manufacturing a semiconductor device according to claim 1, wherein the liner silicon nitride film is a stacked layer of a silicon nitride film and a silicon oxynitride film.

12. A method for manufacturing a semiconductor device, comprising:
    etching a semiconductor substrate using a silicon nitride mask film formed on the semiconductor substrate as a mask to form a first isolation trench corresponding to a first isolation region and a second isolation trench corresponding to a second isolation region having an isolation width wider than that of the first isolation region;
    forming a liner silicon nitride film on at least inner surfaces of the first and second isolation trenches;
    depositing a flowable silazane compound by a CVD method such that the first isolation trench is filled with the flowable silazane compound by overfilling up to a height higher than the upper surface of the silicon nitride mask film in the vicinity of the first isolation trench;
    heat-treating the flowable silazane compound under an oxidizing atmosphere to convert the flowable silazane compound into a first silicon oxide and to densify the first silicon oxide;
    forming a second silicon oxide on the first silicon oxide; and
    planarizing the first and second silicon oxides to the height of the upper surface of the silicon nitride mask film.

13. The method for manufacturing a semiconductor device according to claim 12, wherein the overfilling height of the flowable silazane compound above the first isolation trench is a height of 30 to 70 nm from the upper surface of the silicon nitride mask film.

14. The method for manufacturing a semiconductor device according to claim 12, wherein the heat-treating the flowable silazane compound comprises a heat treatment performed at a temperature of 700° C. to 900° C. for 30 to 120 minutes under a water vapor-containing atmosphere.

15. The method for manufacturing a semiconductor device according to claim 14, wherein the heat-treating the flowable silazane compound comprises a first stage heat treatment performed at a temperature of 200° C. to 600° C., a second stage heat treatment performed at a temperature of 700° C. to 900° C., wherein the first and second stage heat treatments are performed under the water vapor-containing atmosphere, and a third stage heat treatment performed at a temperature of 700° C. to 1000° C. under an inert gas atmosphere.

16. The method for manufacturing a semiconductor device according to claim 12, wherein the second silicon oxide is formed by high density plasma CVD.

17. The method for manufacturing a semiconductor device according to claim 12, wherein the first silicon oxide formed in the second isolation trench has a thickness which does not completely fill the second isolation trench, and the second isolation trench is filled with the second silicon oxide.

18. The method for manufacturing a semiconductor device according to claim 12, comprising, after the planarizing, removing the silicon nitride mask film, and etching back the first and second silicon oxides to the height of a surface of the semiconductor substrate by wet etching.

19. The method for manufacturing a semiconductor device according to claim 18, wherein a condition of the heat-treating the first silicon oxide is controlled such that a wet etching rate ratio of the first silicon oxide to the second silicon oxide is in a range of 0.7 to 1.3.

20. A method for manufacturing a semiconductor device, comprising:
- forming a first isolation trench and a second isolation trench by etching the semiconductor substrate, a width of the second isolation trench being wider than that of the first isolation trench;
- depositing a flowable compound in the second isolation trench and in the first isolation trench, a height of the flowable compound at the first isolation trench being higher than the surface of the semiconductor substrate;
- annealing the flowable compound to convert into a first insulation film; and
- depositing a second insulation film on the first insulation film.

\* \* \* \* \*